(12) United States Patent
Lee

(10) Patent No.: US 7,924,618 B2
(45) Date of Patent: Apr. 12, 2011

(54) METHOD OF PROGRAMMING NON-VOLATILE MEMORY DEVICE

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 248 days.

(21) Appl. No.: 12/240,638

(22) Filed: Sep. 29, 2008

(65) Prior Publication Data
US 2009/0168538 A1 Jul. 2, 2009

(30) Foreign Application Priority Data

Dec. 27, 2007 (KR) .................. 10-2007-0138679
Apr. 3, 2008 (KR) .................. 10-2008-0031161

(51) Int. Cl.
*G11C 16/04* (2006.01)

(52) U.S. Cl. .......... 365/185.18; 365/185.22; 365/185.24

(58) Field of Classification Search ............. 365/185.18, 365/185.17, 185.22, 185.24, 185.29
See application file for complete search history.

(56) References Cited

U.S. PATENT DOCUMENTS

| | | | | |
|---|---|---|---|---|
| 7,151,694 | B2* | 12/2006 | Meihong et al. | 365/185.22 |
| 7,633,813 | B2* | 12/2009 | Wang et al. | 365/185.29 |
| 2006/0274583 | A1* | 12/2006 | Lutze | 365/185.28 |
| 2007/0189080 | A1* | 8/2007 | Liu et al. | 365/185.29 |
| 2008/0137409 | A1* | 6/2008 | Nakamura et al. | 365/185.2 |

FOREIGN PATENT DOCUMENTS

| | | |
|---|---|---|
| KR | 10-2006-0075827 | 7/2006 |
| KR | 10-0612569 | 8/2006 |

* cited by examiner

*Primary Examiner* — Gene N. Auduong
(74) *Attorney, Agent, or Firm* — Marshall, Gerstein & Borun LLP

(57) ABSTRACT

A programming method of a non-volatile memory device may include providing a memory device in which a first word line is preprogrammed in an erase operation of a memory block, pre-programming a second word line according to a program command, and programming the first word line.

21 Claims, 16 Drawing Sheets

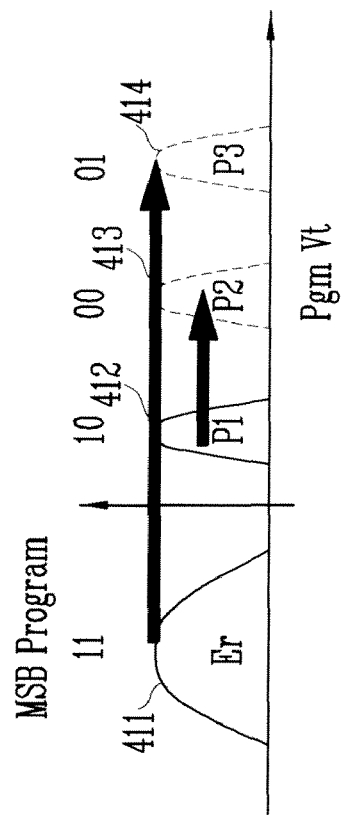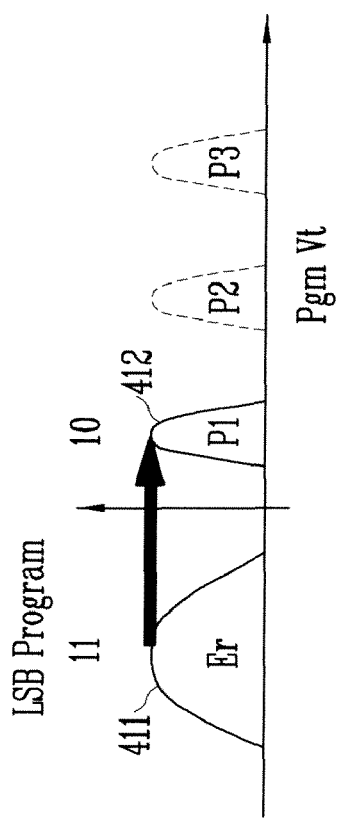
FIG. 4A
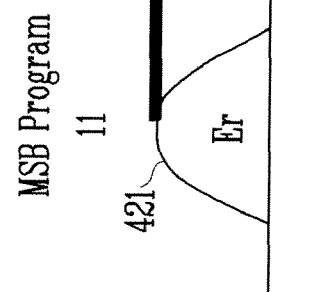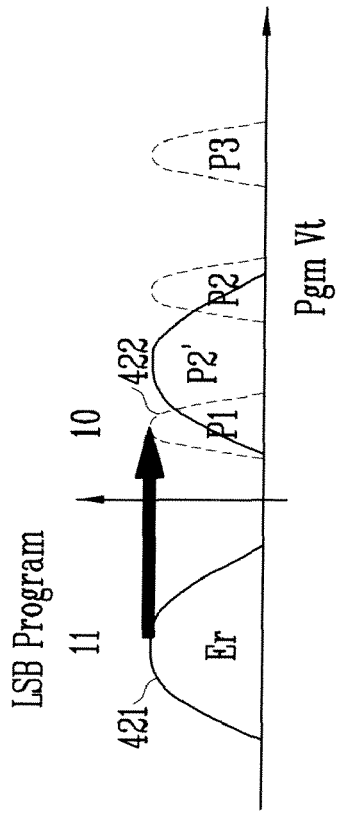
FIG. 4B

METHOD OF PROGRAMMING NON-VOLATILE MEMORY DEVICE

CROSS-REFERENCES TO RELATED APPLICATIONS

The present application claims priority to Korean patent application number 10-2007-0138679, filed on Dec. 27, 2007, and Korean patent application number 10-2008-031161, filed on Apr. 3, 2008, which are incorporated by reference in their entirety.

BACKGROUND OF THE INVENTION

This patent relates to an operation of a non-volatile memory device and, more particularly, to a programming method of a non-volatile memory device, which can reduce the width of a threshold voltage distribution of an erase cell.

Flash memory, that is, non-volatile memory is generally classified into NAND flash memory and NOR flash memory. NOR flash memory has a structure in which memory cells are independently connected to bit lines and word lines and is therefore excellent in a random access time characteristic, whereas NAND flash memory has a structure in which a plurality of memory cells are connected in series, requiring only one contact per cell string, and therefore has an excellent characteristic in terms of the level of integration. Accordingly, the NAND structure is generally used in high-integrated flash memory.

A well-known type of NAND flash memory device includes a memory cell array, a row decoder, and a page buffer. The memory cell array is comprised of a plurality of word lines extending along rows, a plurality of bit lines extending along columns, and a plurality of cell strings corresponding to the bit lines.

A data storage state of a memory cell of the flash memory device is discriminated according to the threshold voltage Vt classified depending on the number of electrons stored in the floating gates. The number of data bits that can be stored in a memory cell depends upon the number of threshold voltage distributions that can be represented by the memory cell.

In general, a single level cell (SLC) includes only threshold voltage distributions representing two states, e.g., erased and programmed states, enabling data bits '1' or '0' to be discriminated.

If a memory cell can be made to have four threshold voltage distributions data can be discriminated like '11', '10', '01', and '00'. Thus, one memory cell can store 2-bit data therein. This memory cell is called a multi-level cell (MLC).

For an MLC to store the 2-bit data therein it must have three threshold voltage distributions at voltage levels of 0 V and higher. Thus, the widths of the threshold voltage distributions need to be made narrow. To affect programming of the MLC, the program voltage applied during programming is increased within a small width.

However, threshold voltage distributions of a MLC become wide because of problems, such as interference, back pattern dependency, and source line resistance, as well as the program voltage problem.

FIG. 1 is a diagram showing threshold voltage distributions changed by environmental factors of memory cells.

FIG. 1 illustrates an ideal narrow width threshold voltage distribution 110 that, whereas a threshold voltage distribution 120 is influenced by back pattern dependency, a threshold voltage distribution 130 is influenced by source noise, and a threshold voltage distribution 140 is influenced by an interference phenomenon. Each of the voltage distributions 120, 130 and 140 has a wide width.

In particular, it can be seen that the threshold voltage distribution 140 affected by the interference phenomenon has the widest width. The interference phenomenon is generated by the influence of memory cells adjacent to a specific memory cell.

FIG. 2 is a diagram showing capacitance between peri cells, which generates an interference phenomenon between a memory cell and the peri cells. This drawing shows first to ninth memory cells C0 to C8 of the plurality of memory cells of a flash memory array. Capacitance coupling is generated between floating gates between the second to ninth memory cells C1 to C8 surrounding the first memory cell C0.

If, after the first memory cell C0 is programmed, the threshold voltage of any one of the neighboring second to ninth memory cells C1 to C8 is changed by a program voltage, the threshold voltage of the first memory cell C0 is changed due to capacitance coupling.

FIGS. 3A and 3B illustrate coupling capacitance due to an interference phenomenon between memory cells. This drawing shows the occurrence of coupling capacitance between floating gates FG. This coupling capacitance is a physical factor in terms of the structure of a memory cell. The coupling capacitance is proportional to an area A and also proportional to the dielectric constant of dielectric material therebetween, but is in inverse proportion to a distance t, as indicated by a capacitance equation of a general capacitor.

As the size of a flash memory device reduces, the distance between memory cells, e.g., "t", decreases. Thus, the capacitance problem must be solved by looking to changes in the height of a floating gate, shielding of the dielectric material, reduction in the dielectric constant, and so on.

Further, available methods of preventing the interference phenomenon can include reducing the occurrence of interference coupling by relatively increasing the gate coupling ratio or changing a programming method from a random method to a sequential method. Alternatively, a method of minimizing a degree that the threshold voltage distribution of a memory cell is changed for a program can be used.

FIGS. 4A and 4B illustrate the shift of threshold voltages depending on assignment of data codes. Referring to FIG. 4A, data '11', '10', '00', and '01' are respectively set to memory cells having first to fourth threshold voltage distributions 411 to 414 in order of higher threshold voltage distributions. In this state, a least significant bit (LSB) program operation is performed such that some of the memory cells having the first threshold voltage distribution 411 are shifted and therefore included in the second threshold voltage distribution 412.

Next, through a most significant bit (MSB) program operation, some of the memory cells having the first threshold voltage distribution 411 are shifted and then included in the fourth threshold voltage distribution 414, or some of the memory cells having the second threshold voltage distribution 412 are shifted and then included in the third threshold voltage distribution 413.

As can be seen from FIG. 4B, a case where the shift amount of the threshold voltage is the greatest when programming the memory cells is the case where some of the memory cells having the first threshold voltage distribution 411 are shifted and then included in the fourth threshold voltage distribution 414. As the shift amount of the threshold voltage increases as described above, memory cells are influenced by more interference. Thus, a method of setting the program codes and performing a program as shown in FIG. 4B can be used. In this case, it can be seen that the shift amount of the threshold voltage by the program is reduced.

However, although this method is used, it is ineffectual as the distance between memory cells is narrowed with shrinking of the size of the memory device leading to an increase in the interference ratio.

BRIEF SUMMARY OF THE INVENTION

The present invention is directed towards a method of programming a non-volatile memory device, which can make narrow the width of a threshold voltage distribution of an erase cell of a non-volatile memory device.

A method of programming a non-volatile memory device according to an embodiment of the present invention may include providing a memory device in which a first word line is pre-programmed in an erase operation of a memory block, pre-programming a second word line according to a program command, and programming the first word line.

The pre-program operation may be performed on only on erase memory cells.

A pre-program voltage for the pre-program operation may be lower than that for the program operation.

When a memory cell of the memory block stores first and second bit data therein, the pre-program operation may be included in only one of a first bit program operation or a second bit program operation.

A method of programming a non-volatile memory device according to an embodiment of the present invention may include providing a memory device in which a first word line is pre-programmed in an erase operation of a memory block, applying a program voltage to the first word line according to a program command, and applying a first pass voltage to a second word line, and programming word lines other than the first and second word lines by applying a second pass voltage to the word lines other than the first and second word lines.

The first pass voltage may be higher than the second pass voltage, but lower than the program voltage.

Erase cells of the second word line may be pre-programmed by the first pass voltage.

When a memory cell of the memory block stores first and second bit data therein, the pre-program operation may be included in only a first bit program or a second bit program.

The pre-program operation may be performed on only erase memory cells.

A method of programming a non-volatile memory device according to an embodiment of the present invention may include after a memory block is erased, pre-programming a first word line selected for a program according to a program command, and programming the first word line by applying a program voltage to the first word line.

The pre-program operation may be performed on only erase memory cells.

The method may further include after the first word line is pre-programmed, applying the program voltage to the first word line, and applying a first pass voltage to a second word line that will be programmed subsequently to the first word line, and programming word lines other than the first and second word lines by applying a second pass voltage to the word lines other than the first and second word lines.

The first pass voltage may be higher than the second pass voltage, but lower than the program voltage.

Erase cells of the second word line may be pre-programmed by the first pass voltage.

When a memory cell of the memory block stores first and second bit data therein, the pre-program operation may be included in only a first bit program or a second bit program.

A method of programming a non-volatile memory device according to an embodiment of the present invention may include after a memory block is erased, pre-programming a first word line, which is selected for a program according to a program command, and a second word line that will be programmed subsequently to the first word line, programming the first word line by applying a program voltage to the first word line, per-programming a third word line that will be programmed subsequently to the second word line, and programming the second word line by applying a program voltage to the second word line.

The pre-program operation may be performed on only erase memory cells.

A method of programming a non-volatile memory device according to an embodiment of the present invention may include, in pre-programming a first word line selected for a program according to a program command after a memory block is erased, performing a program operation on the first word line by applying a pre-program voltage for pre-programming the first word line to the first word line, and performing the program operation on the first word line by increasing a voltage level of the program voltage.

The pre-program operation may be performed on only erase memory cells.

The pre-program voltage may be lower than the program voltage.

When programming the first word line, a first pass voltage may be applied to a second word line that will be programmed subsequently to the first word line and a second pass voltage is applied to word lines other than the first and second word lines.

The first pass voltage may be higher than the second pass voltage, but lower than the program voltage.

Erase cells of the second word line may be pre-programmed by the first pass voltage.

A method of programming a non-volatile memory device according to an embodiment of the present invention may include, in an erase operation of a memory block, performing pre-program and verification operations on the entire word lines per on a bit basis, and performing a program operation according to a subsequent program command.

A voltage for the pre-program operation may be lower than a voltage for the program operation.

A method of programming a non-volatile memory device according to an embodiment of the present invention may include, in an erase operation of a memory block, performing pre-program and verification operations on word lines other than a word line, which is programmed finally, per on a bit basis, and performing a program operation according to a subsequent program command.

A method of programming a non-volatile memory device according to an embodiment of the present invention may include, in an erase operation of a memory block, pre-programming first word lines belonging to an even or odd group, determining whether a word line, which is selected for a program according to a program command, belongs to the first word lines, if, as a result of the determination, the selected word line belongs to the first word lines, performing a pre-program operation on a word line being adjacent to a drain select line of the selected word line, and performing the program operation on the selected word line.

BRIEF DESCRIPTION OF THE DRAWINGS

FIGS. 4A and 4B illustrate the shift of threshold voltages depending on assignment of data codes;

DESCRIPTION OF SPECIFIC EMBODIMENTS

Now, specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined solely by the claims.

Figure 1:
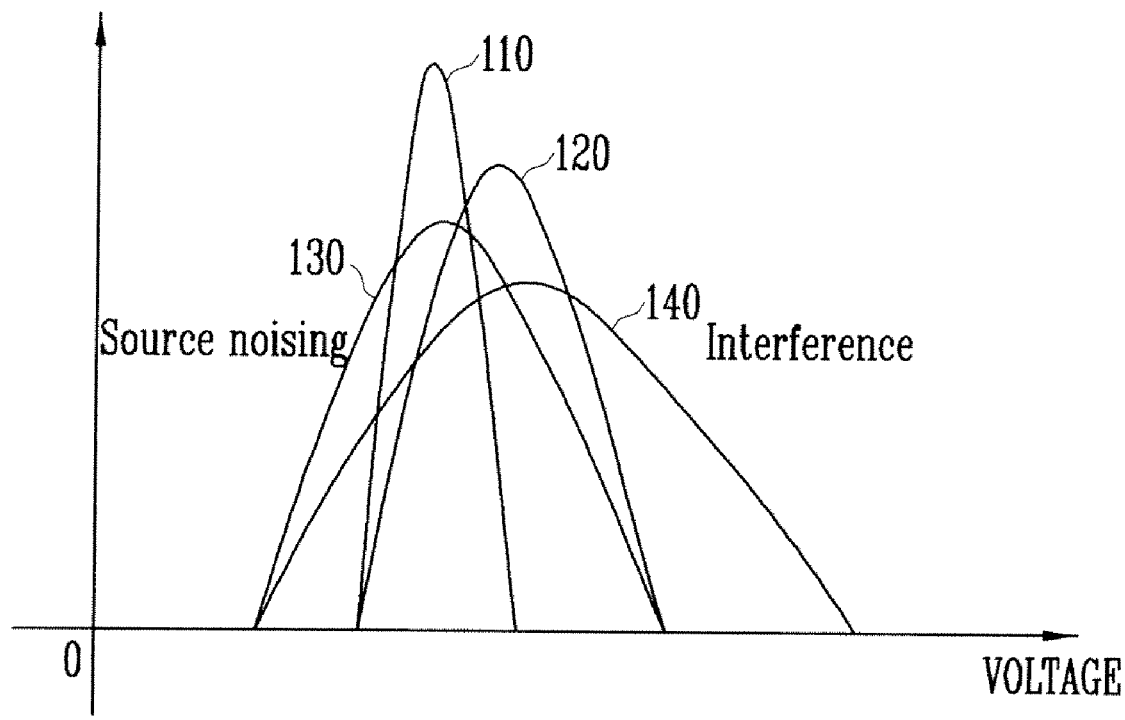
FIG. 1 is a diagram showing threshold voltage distributions changed by environmental factors of memory cells.
Figure 2:
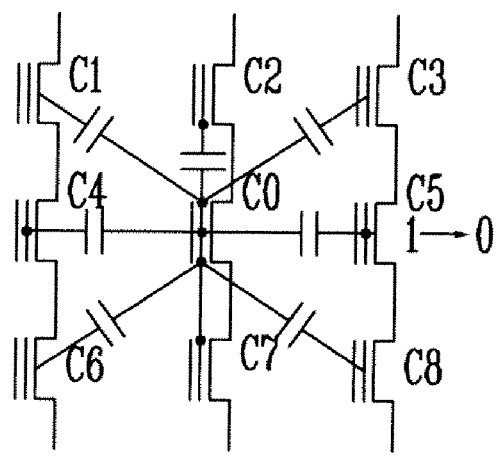
FIG. 2 is a diagram showing capacitance between peri cells, which generates an interference phenomenon between a memory cell and the peri cells.
Figure 3A:
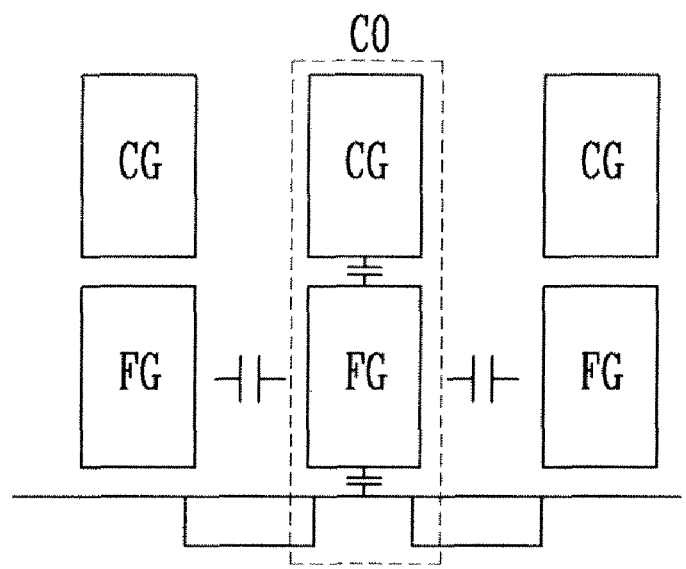
FIGS. 3A and 3B illustrate coupling capacitance due to an interference phenomenon between memory cells.
Figure 3B:
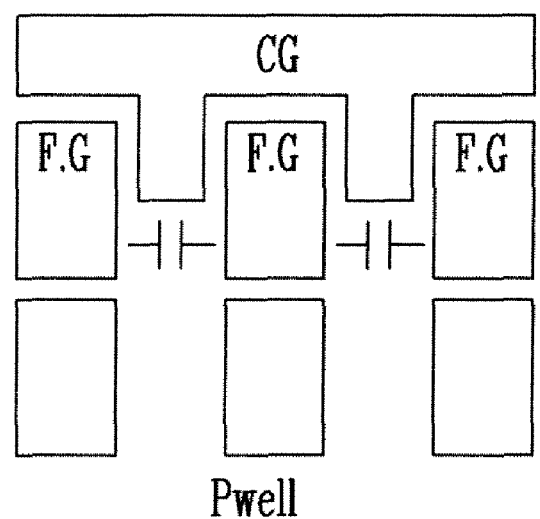
Figure 5:
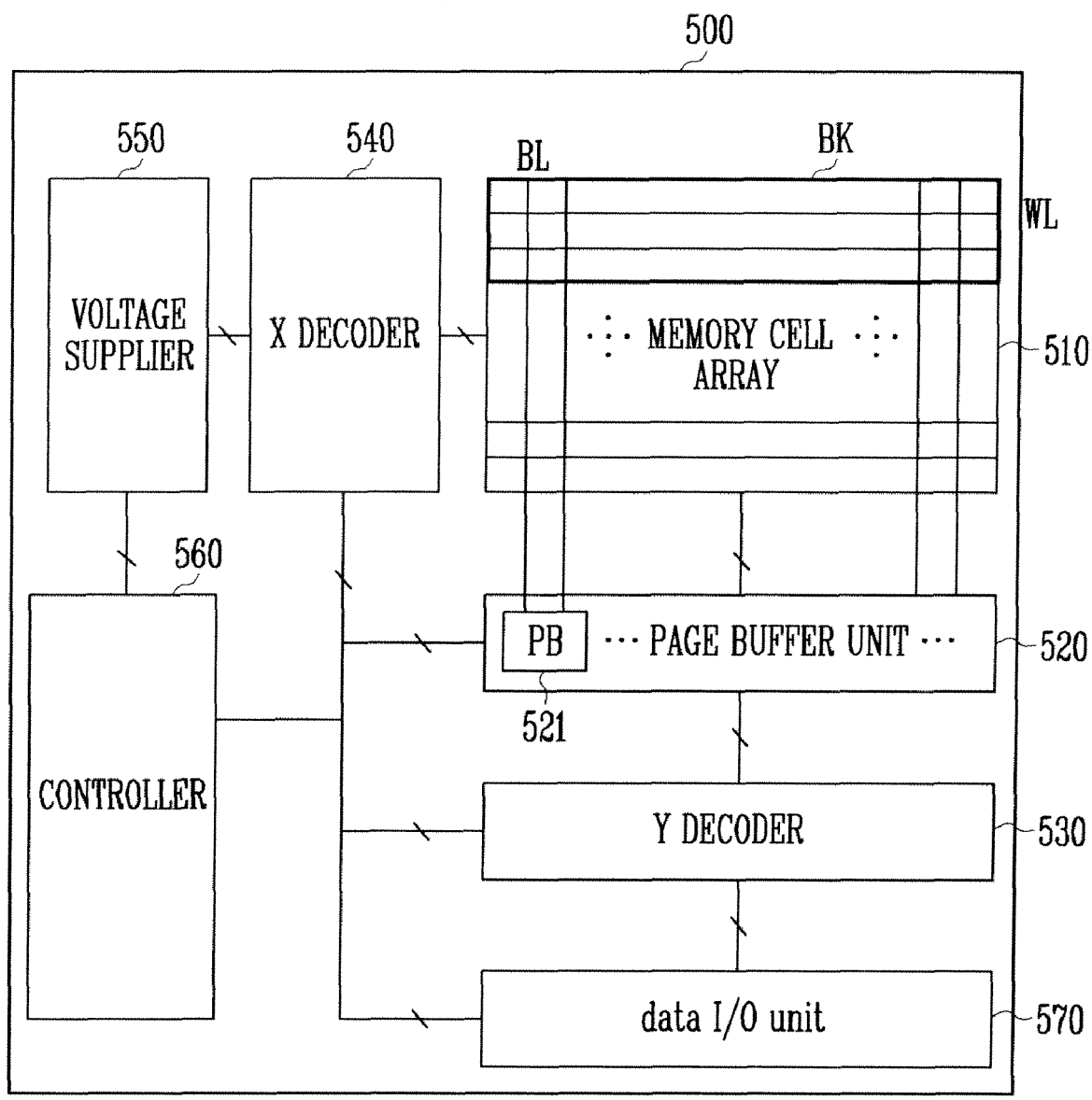
FIG. 5 is a block diagram of a flash memory device.

A flash memory device 500 in accordance with the embodiment illustrated in FIG. 5 includes a memory cell array 510, a page buffer unit 520, a Y decoder 530, an X decoder 540, a voltage supplier 550 and a controller 560.

The memory cell array 510 includes memory blocks BK having memory cells for storing data therein. The memory block BK includes a plurality of cell strings in each of which the memory cells are connected in series. Each cell string is connected to a bit line BL. The gates of the memory cells are connected to a word line WL in a direction orthogonal to the bit line.

The page buffer unit 520 includes a plurality of page buffers 521 connected to the bit line of the memory cell array 510. Each page buffer temporarily stores therein data to be programmed into a selected memory cell and transfers the data to the memory cell through a bit line, or reads data stored in a memory cell and stores the read data therein.

The Y decoder 530 provides an I/O path to the page buffer 521 of the page buffer unit 520 according to an input address. The X decoder 540 selects a word line of the memory cell array 510 according to an input address.

The voltage supplier 550 generates an operating voltage, which will be supplied to a word line connected by the X decoder 540, under the control of the controller 560. The controller 560 outputs a control signal according to an operation command and controls the voltage supplier 550 to supply a pass voltage. The pass voltage is set according to a degree that data of the memory cell array 510 is programmed.

A data I/O unit 570 is responsible for the input/output of data in response to the control signal from the controller 560.

The memory cells of the memory cell array 510 are programmed according to input data and erased by memory block (BK).

Figure 6A:
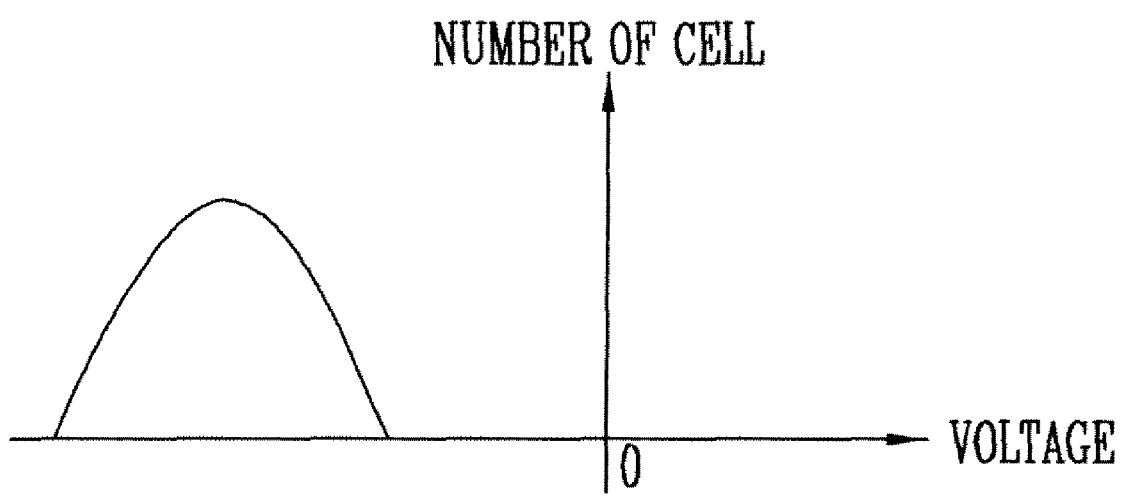
FIGS. 6a and 6b illustrate the shift of threshold voltages according to a pre-program in accordance with an embodiment of the present invention.
Figure 6B:
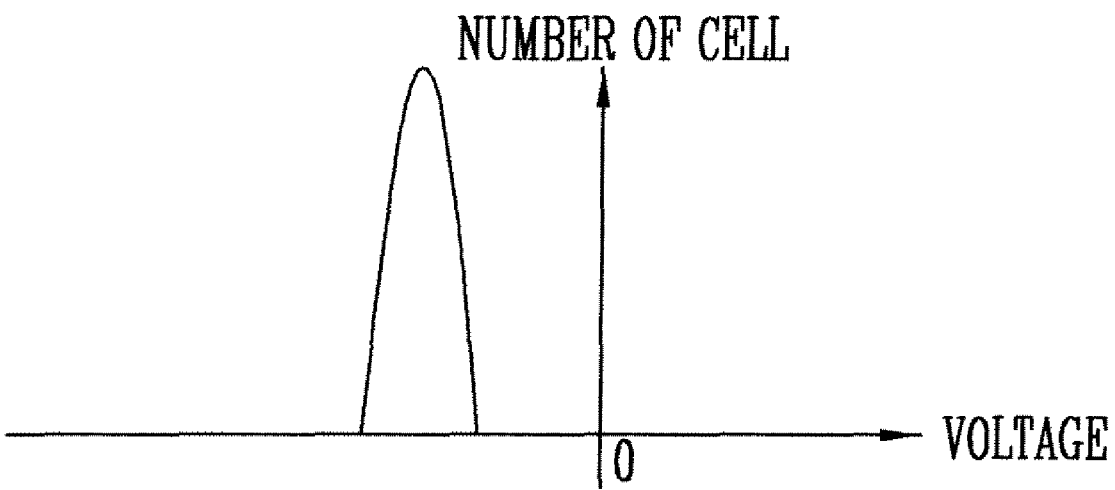

FIGS. 6a and 6b illustrate the shift of threshold voltages according to a pre-program in accordance with an embodiment of the present invention.

In particular, FIG. 6a shows the threshold voltage distribution of an erase cell before a pre-program is performed and FIG. 6b shows the threshold voltage distribution of an erase cell after a pre-program is performed.

Referring to FIGS. 6a and 6b, program and erase operations are repeatedly performed on the memory block BK according to a data input/output. When the erase operation is performed, the entire memory block BK is erased.

That is, as shown in FIG. 6a, the erase operation is performed so that all of the memory cells of the memory block BK have a threshold voltage of 0V or less. Here, when the threshold voltage distribution of the erase cells is not close to 0V, but the width of the threshold voltage distribution is wide as shown in FIG. 6a, significant interference occurs when a subsequent program operation is performed. This is because as the threshold voltage of an erase cell falls below 0V, the shift of the threshold voltage, which is changed when a program operation is performed over 0V, is great.

This interference can be reduced by making the threshold voltage distribution of an erase cell close to 0V and narrowing the width of the threshold voltage distribution as shown in FIG. 6b. Here, a pre-program voltage, Vpgm1 is applied to a word line for pre-programming. Vpgm1 is higher than a program voltage Vpgm. The pre-program voltage Vpgm1 is applied to program cells of an erase state so that the cells have the threshold voltage close to 0V. Thus, the pre-program is performed only on erase cells.

A method of programming a MLC using the above pre-program method can be performed in various ways.

A variety of pre-program operations are described below. Here, a process of performing the pre-program is generally described and a general program process description is omitted.

Figure 7:
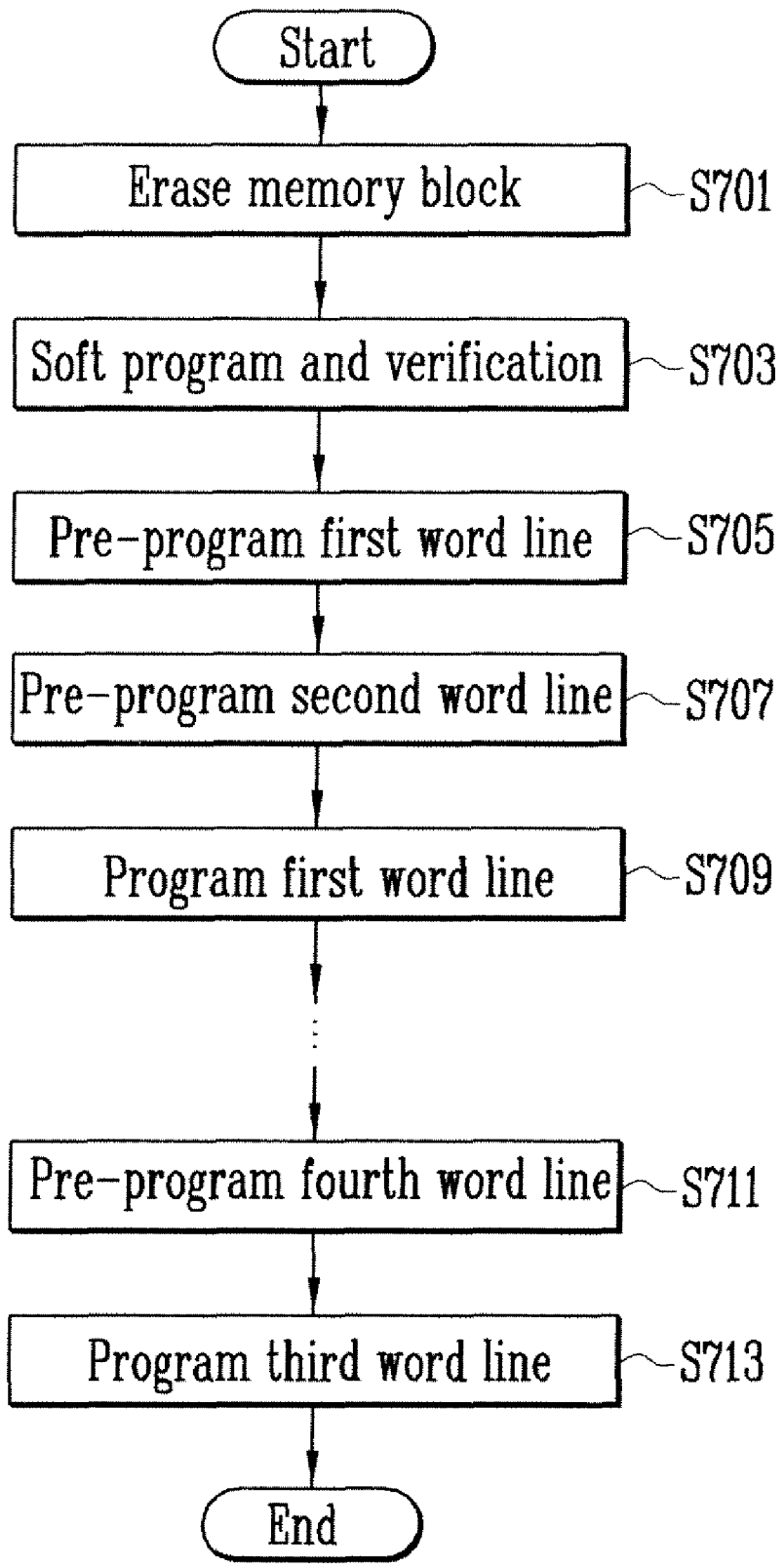
FIG. 7 is a flowchart illustrating a program operation in accordance with an embodiment of the present invention.

FIG. 7 is a flowchart illustrating a program operation in accordance with an embodiment of the present invention.

The following Table 1 lists voltages applied to word lines when the program operation is performed according to an embodiment of the present invention.

TABLE 1

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |

TABLE 1-continued

| | Mode | WL<0> | WL<1> | WL<2> | WL<3> | WL<4> |
|---|---|---|---|---|---|---|
| | Verify | | | Vverify_erase | | |
| | Pre-program | Vpgm1 | Vpass | Vpass | Vpass | Vpass |
| | Program verify | Vverify | Vread | Vread | Vread | Vread |
| MSB (WL<0>) | Pre-program WL<0> | Vpass Vpgm | Vpgm1 Vpass | Vpass Vpass | Vpass Vpass | Vpass Vpass |
| MSB (WL<1>) | Pre-program WL<1> | Vpass Vpass | Vpass Vpgm | Vpgm1 Vpass | Vpass Vpass | Vpass Vpass |
| MSB (WL<2>) | Pre-program WL<2> | Vpass Vpass | Vpass Vpass | Vpass Vpgm | Vpgm1 Vpass | Vpass Vpass |

Referring to FIG. 7 and Table 1, the erase operation of the memory block BK is performed in the same manner as that of a general method at step S701. That is, a high voltage is applied to a P well and 0V is applied to the word lines, thus erasing the memory cells. Thereafter, the post-program voltage for a soft program is applied to the entire word lines and erase verification is then performed at step S703.

Before the erase operation is finished, the pre-program is performed on the first word line WL<0> at step S705. The program operation of step S705 includes performing the same verification operation as a general verification operation.

After the erase operation of steps S701 to S705 is completed, a LSB program operation and a MSB program operation are performed according to a program command. Here, description of the LSB program operation is omitted because it is performed in the same manner as that of a general non-volatile memory device. The LSB program operation and the MSB program operation can be performed according to various sequences depending on the program schedule of a flash memory device. It is assumed that the LSB program operation is performed on a corresponding page before the MSB program operation is performed.

Assuming that in this embodiment of the present invention, a program operation is performed from the first word line WL<0> to the third word line WL<2>, only the MSB program operation is described. Pre-program and verification may be performed on a next word line close to a drain select line rather than a word line that is preferably programmed first.

In other words, before the MSB program operation is performed on the first word line WL<0>, the pre-program operation is performed on a next second word line WL<1> by applying the pre-program voltage Vpgm1 to the second word line WL<1> at step S707. Here, the pre-program operation is performed only on erase cells on which a program operation has not yet been performed in the second word line WL<1>. To this end, a bit line to which memory cells that have been programmed are connected, of memory cells of the second word line WL<1>, is supplied with a power supply voltage for program-inhibition.

After the pre-program operation is performed on the second word line WL<1>, the MSB program operation is performed on the first word line WL<0> by applying the program voltage Vpgm to the first word line WL<0> at step S709.

As described above, the MSB program operation is performed up to the third word line WL<2> in such a manner that the pre-program operation is first performed on a next word line in the DSL direction and a selected word line is then programmed at steps S711 and S713.

If the pre-program operation is first performed on a next word line in the DSL direction and a selected word line is then programmed as described above, the shift of voltages becomes small although neighboring cells change to programmed cells in an erase cell state. Accordingly, the interference phenomenon can be reduced.

Figure 8:
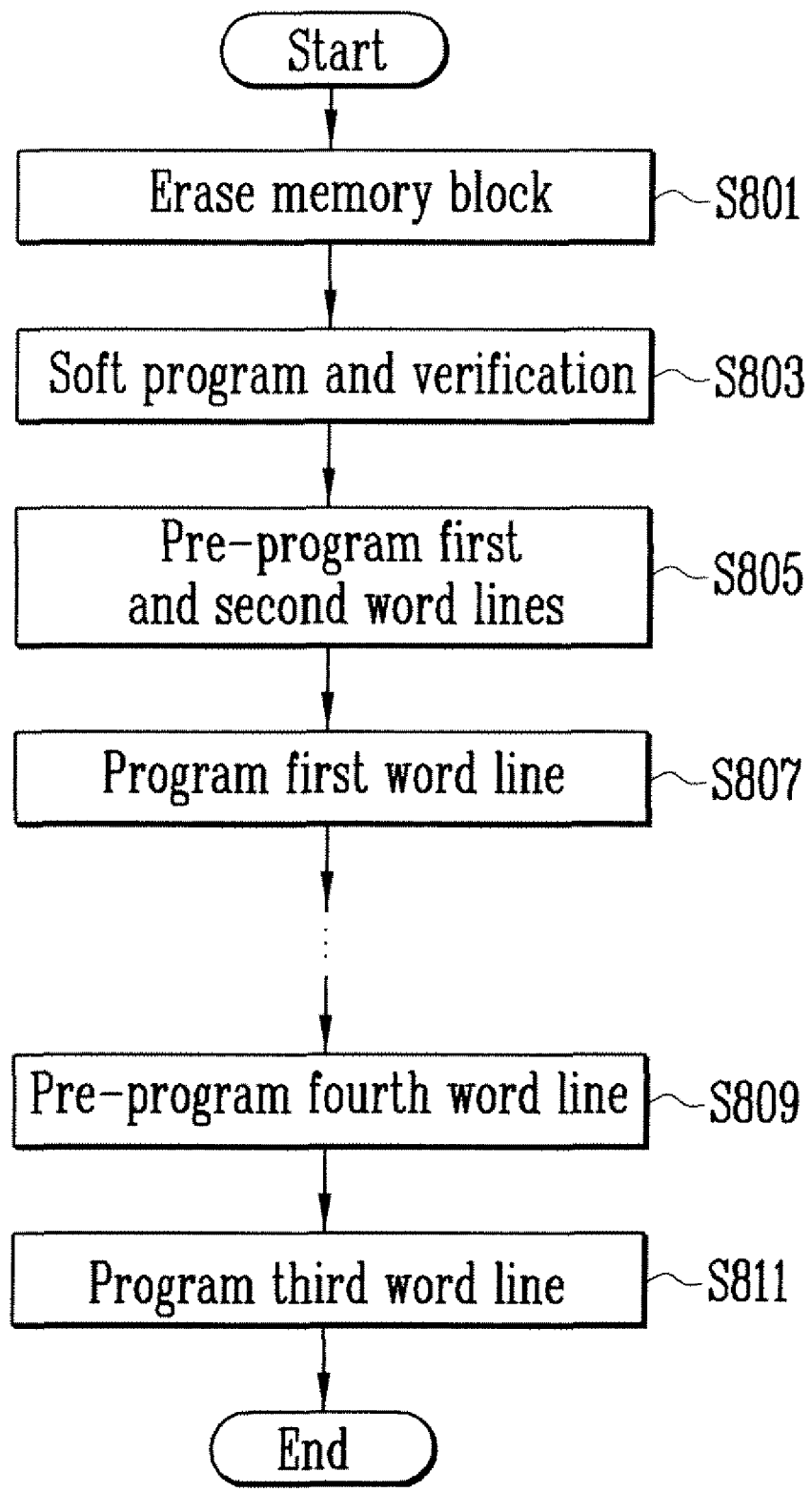
FIG. 8 is a flowchart illustrating a program operation in accordance with another embodiment of the present invention.

FIG. 8 is a flowchart illustrating a program operation in accordance with another embodiment of the present invention.

Table 2 lists voltages applied to word lines when the program operation is performed according to this embodiment of the present invention.

TABLE 2

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |
| | Verify | | | Vverify_erase | | |
| MSB (WL<0>) | Pre-program WL<0> | Vpgm1 Vpgm | Vpgm1 Vpass | Vpass Vpass | Vpass Vpass | Vpass Vpass |
| MSB (WL<1>) | Pre-program WL<1> | Vpass Vpass | Vpass Vpgm | Vpgm1 Vpass | Vpass Vpass | Vpass Vpass |
| MSB (WL<2>) | Pre-program WL<2> | Vpass Vpass | Vpass Vpass | Vpass Vpgm | Vpgm1 Vpass | Vpass Vpass |

Referring to FIG. 8 and Table 2, the erase operation of the memory block BK is performed in the same manner as that of a general method at step S801. That is, a high voltage is applied to a P well and 0V is applied to the word lines, thus erasing the memory cells. Thereafter, the post-program voltage for a soft program is applied to the entire word lines and erase verification is then performed at step S803.

After erasure is completed, a pre-program operation is performed. The pre-program operation is performed on the first word line WL<0> and the second word line WL<1> by applying the pre-program voltage Vpgm1 to the first word line WL<0> and the second word line WL<1> at step S805. Here, only memory cells of an erase cell state, of the memory cells in the first and second word lines WL<0> and WL<1>, are pre-programmed.

After the pre-program operation is completed, a MSB program operation is performed on the first word line WL<0> at step S807. The pre-program operation is then preformed on the third word line WL<2>, that is, a next word line toward the DSL line of a word line that will be subsequently programmed. The second word line WL<1> is then programmed at steps S809 and S811.

Figure 9:
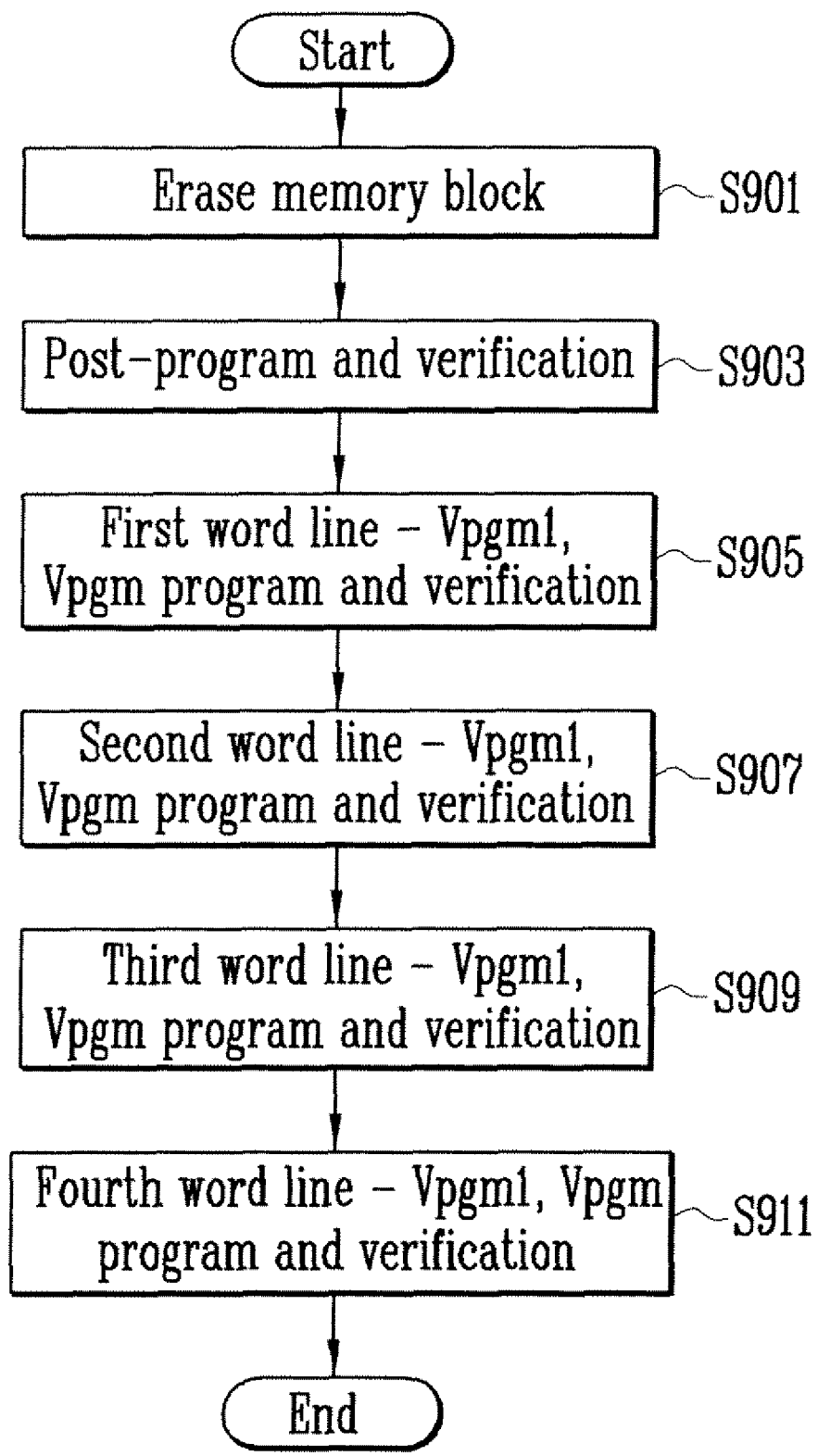
FIG. 9 is a flowchart illustrating a program operation in accordance with another embodiment of the present invention.

FIG. 9 is a flowchart illustrating a program operation in accordance with another embodiment of the present invention.

Table 3 lists voltages applied to word lines when the program operation is performed according to this embodiment of the present invention.

TABLE 3

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |
| | Verify | | | Vverify_erase | | |
| LSB (WL<0>) | Pre&program WL<0> | Erase cell Program cell | Vpgm1 Vpgm | Vpass Vpass | Vpass Vpass | Vpass Vpass | Vpass Vpass |
| LSB | Pre&program | Erase cell | Vpass | Vpgm1 | Vpass | Vpass | Vpass |

TABLE 3-continued

| | Mode | | WL<0> | WL<1> | WL<2> | WL<3> | WL<4> |
|---|---|---|---|---|---|---|---|
| (WL<1>) | WL<1> | Program cell | Vpass | Vpgm | Vpass | Vpass | Vpass |
| LSB | Pre&program | Erase cell | Vpass | Vpass | Vpgm1 | Vpass | Vpass |
| (WL<2>) | WL<2> | Program cell | Vpass | Vpass | Vpgm | Vpass | Vpass |
| LSB | Pre&program | Erase cell | Vpass | Vpass | Vpass | Vpgm1 | Vpass |
| (WL<3>) | WL<3> | Program cell | Vpass | Vpass | Vpass | Vpgm1 | Vpass |

Referring to FIG. 9 and Table 3, the erase operation of the memory block BK is performed in the same manner as that of a general method at step S901. That is, a high voltage is applied to a P well and 0V is applied to the word lines, thus erasing the memory cells. Thereafter, the post-program voltage for a soft program is applied to the entire word lines and erase verification is then performed at step S903.

A LSB program operation is performed on the first word line WL<0> at step S905. Here, memory cells connected to the first word line WL<0> are all in an erase cell state.

In the LSB program operation of the first word line WL<0>, memory cells of an erase cell state are pre-programmed by applying the pre-program voltage Vpgm1 to the first word line WL<0>. When verification of the pre-program operation is pass, the program voltage Vpgm is applied to the first word line WL<0> and a LSB program operation according to an input data is performed. This method is performed at once in a program operation by increasing a program voltage, which is applied to the first word line WL<0>, from the pre-program voltage Vpgm1 to the program voltage Vpgm.

In the same manner as the above method, in a LSB program operation of other word lines, a pre-program operation and a program operation are performed on the other word lines at the same time. A MSB program operation of each word line is identical to that of a general MSB program operation at steps S907 and S911.

Figure 10:
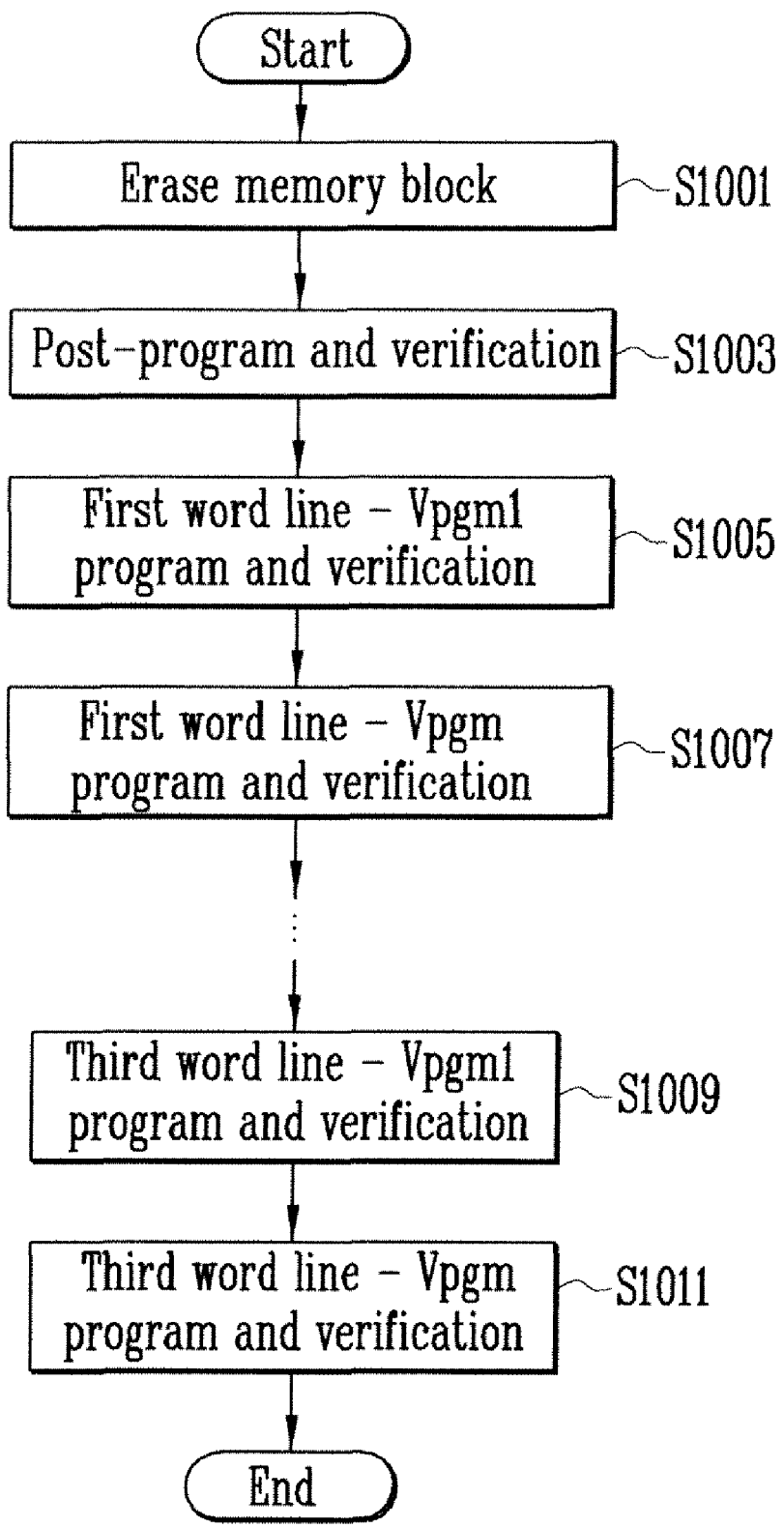
FIG. 10 is a flowchart illustrating a program operation in accordance with another embodiment of the present invention.

FIG. 10 is a flowchart illustrating a program operation in accordance with another embodiment of the present invention.

Table 4 lists voltages applied to word lines when the program operation is performed according to this embodiment of the present invention.

TABLE 4

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |
| | Verify | | | Vverify_erase | | |
| LSB (WL<0>) | Pre-program WL<0> | Vpgm1 Vpgm | Vpass Vpass | Vpass Vpass | Vpass Vpass | Vpass Vpass |
| LSB (WL<1>) | Pre-program WL<1> | Vpass Vpass | Vpgm1 Vpgm | Vpass Vpass | Vpass Vpass | Vpass Vpass |
| LSB (WL<2>) | Pre-program WL<2> | Vpass Vpass | Vpass Vpass | Vpgm1 Vpgm | Vpass Vpass | Vpass Vpass |

Referring to FIG. 10 and Table 4, the erase operation of the memory block BK is performed in the same manner as that of a general method at step S1001. That is, a high voltage is applied to a P well and 0V is applied to the word lines, thus erasing the memory cells. Thereafter, the post-program voltage for a soft program is applied to the entire word lines and erase verification is then performed at step S1003.

Before a LSB program operation is performed on the first word line WL<0>, a pre-program operation is performed on the first word line WL<0> by applying the pre-program voltage Vpgm1 to the first word line WL<0> at step S1005. Next, the LSB program operation is performed on the first word line WL<0> by applying the program voltage Vpgm to the first word line WL<0> at step S1007.

A MSB program operation is identical to that of a general program method. In other words, before a LSB program operation is performed on each word line, a pre-program operation is preformed at steps S1009 to S1011.

Figure 11:
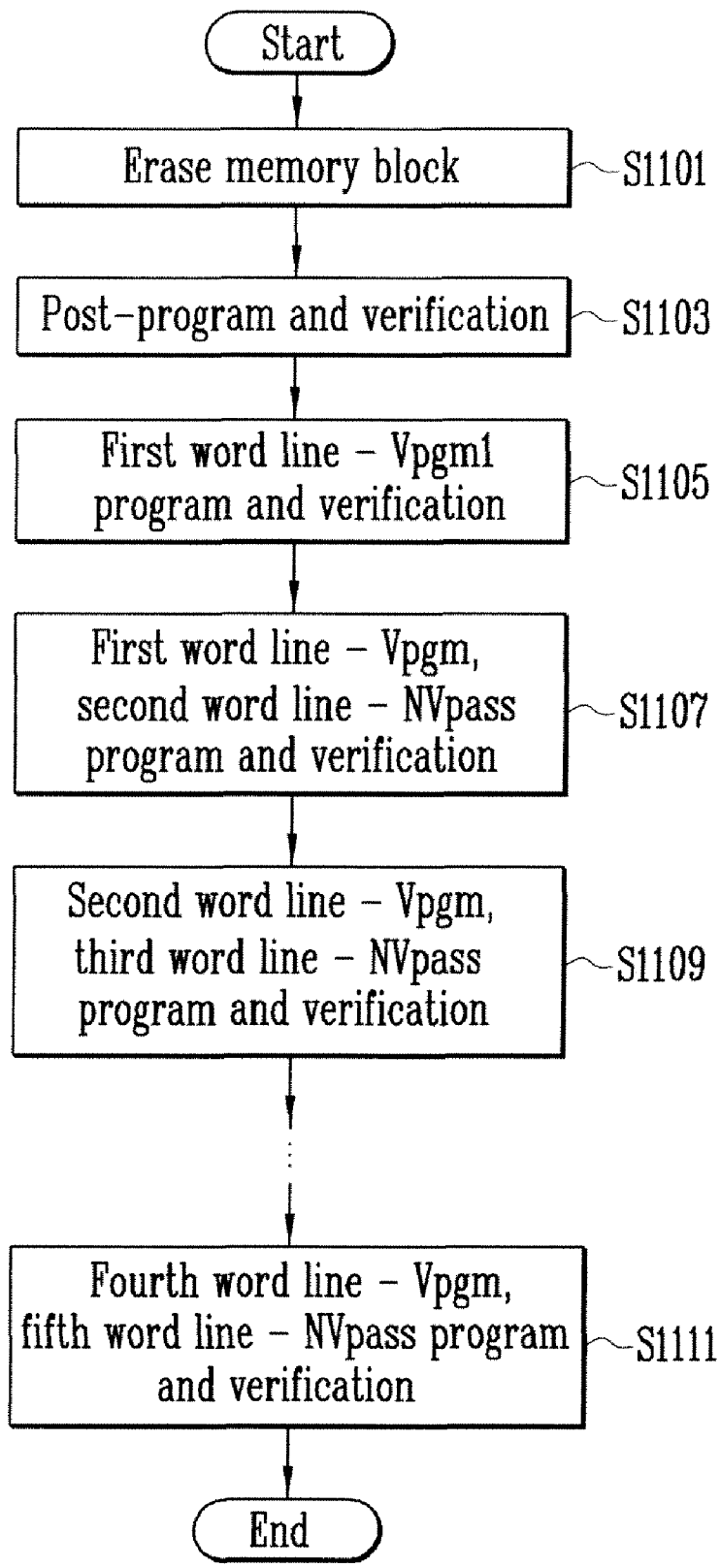
FIG. 11 is a flowchart illustrating a program operation in accordance with another embodiment of the present invention.

FIG. 11 is a flowchart illustrating a program operation in accordance with another embodiment of the present invention.

Table 5 lists voltages applied to word lines when the program operation is performed according to this embodiment of the present invention.

TABLE 5

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |
| | Verify | | | Verify_erase | | |
| | Pre-program | Vpgm1 | Vpass | Vpass | Vpass | Vpass |
| | Program verify | Vverify | Vread | Vread | Vread | Vread |
| MSB (WL<0>) | Pre-program WL<0> | Vpgm | NVpass | Vpass | Vpass | Vpass |
| MSB (WL<1>) | Pre-program WL<1> | Vpass | Vpgm | NVpass | Vpass | Vpass |
| MSB (WL<2>) | Pre-program WL<2> | Vpass | Vpass | Vpgm | NVpass | Vpass |
| MSB (WL<3>) | Pre-program WL<3> | Vpass | Vpass | Vpass | Vpgm | NVpass |

Referring to FIG. 11 and Table 5, the erase operation of the memory block BK is performed in the same manner as that of a general method at step S1101. That is, a high voltage is applied to a P well and 0V is applied to the word lines, thus erasing the memory cells. Thereafter, the post-program voltage for a soft program is applied to the entire word lines and erase verification is then performed at step S1103.

Pre-program and verify operations are then performed on the first word line WL<0> by applying the pre-program voltage Vpgm1 to the first word line WL<0> at step S1105. Here, the pre-program operation is included in the erase operation of the memory block. That is, although a subsequent program operation is not performed after the memory block is erased, the erase operation is completed by performing the pre-program operation of the first word line WL<0>.

Next, a LSB program operation is performed according to a general method. A MSB program operation is then performed on the first word line WL<0>. Here, the first word line WL<0> is applied with the program voltage Vpgm and at the same time, the second word line WL<1> adjacent to the first word line WL<0> is applied with the pre-pass voltage NVpass 1107. The pre-pass voltage NVpass is higher than the pass voltage Vpass, but lower than the program voltage Vpgm. The pre-pass voltage NVpass has a function of pre-programming the second word line WL<1> according to the pre-pass voltage NVpass while the MSB program operation is performed on the first word line WL<0>.

As described above, according to this embodiment of the present invention, when a MSB program operation is performed after the pre-program operation of the first word line WL<0> is completed in the erase operation, the program voltage Vpgm is applied to a selected word line and at the same time, the pre-pass voltage NVpass, which can have a pre-program effect, is applied to a word line that will be programmed next time at steps S1109 to S1111.

Figure 12:
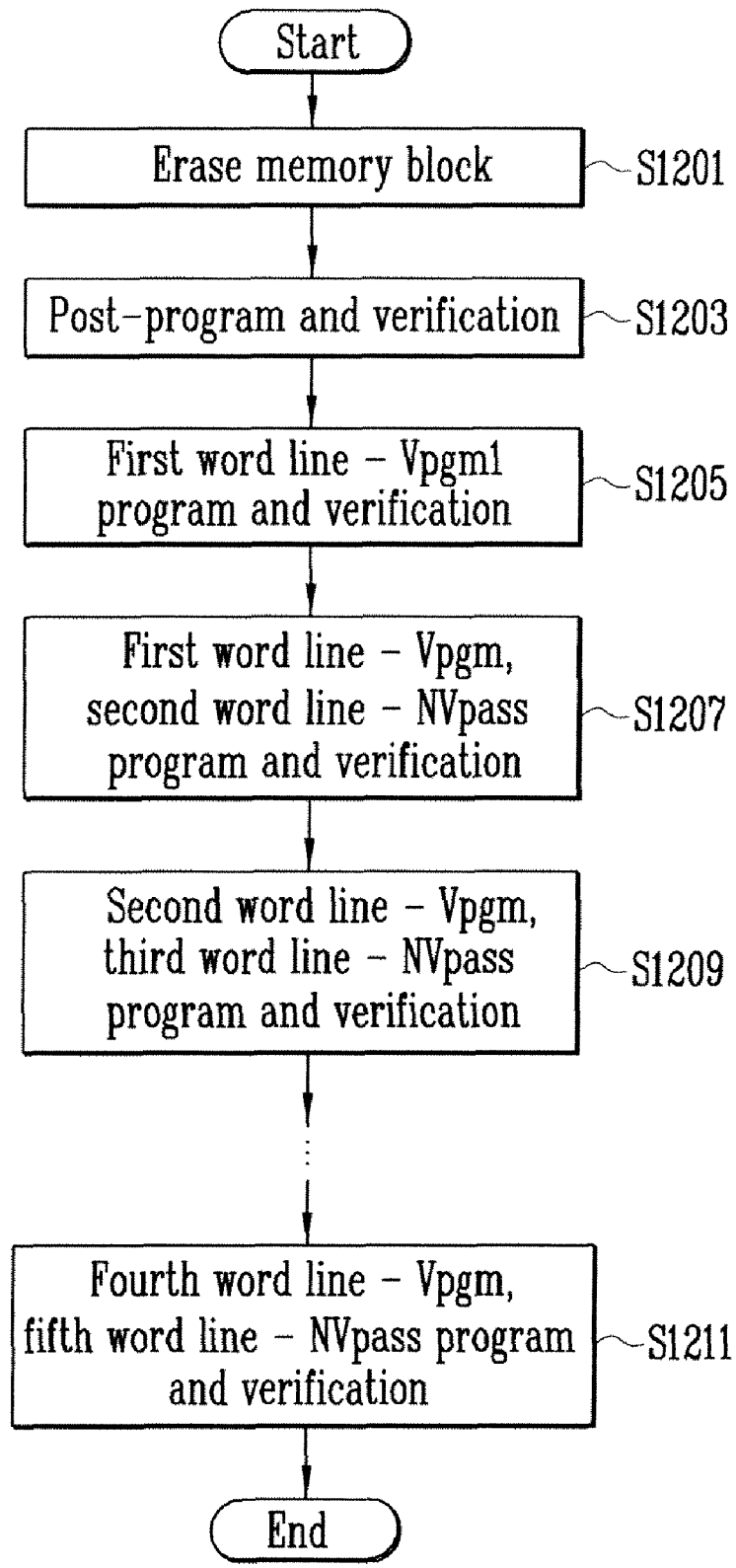
FIG. 12 is a flowchart illustrating a program operation in accordance with another embodiment of the present invention.

FIG. 12 is a flowchart illustrating a program operation in accordance with another embodiment of the present invention.

Table 6 lists voltages applied to word lines when the program operation is performed according to this embodiment of the present invention.

TABLE 6

| | Mode | WL<0> | WL<1> | WL<2> | WL<3> | WL<4> |
|---|---|---|---|---|---|---|
| Erase | Erase | 0 V | | | | |
| | Post-program Verify | Vpgm1 | | | | |
| | | Vverify_erase | | | | |
| | Pre-program | Vpgm1 | Vpass | Vpass | Vpass | Vpass |
| | Program verify | Vverify | Vread | Vread | Vread | Vread |
| LSB (WL<0>) | Pre-program WL<0> | Vpgm | NVpass | Vpass | Vpass | Vpass |
| LSB (WL<1>) | Pre-program WL<1> | Vpass | Vpgm | NVpass | Vpass | Vpass |
| LSB (WL<2>) | Pre-program WL<2> | Vpass | Vpass | Vpgm | NVpass | Vpass |
| LSB (WL<3>) | Pre-program WL<3> | Vpass | Vpass | Vpass | Vpgm | NVpass |

Referring to FIG. 12 and Table 6, the erase operation of the memory block BK is performed in the same manner as that of a general method at step S1201. That is, a high voltage is applied to a P well and 0V is applied to the word lines, thus erasing the memory cells. Thereafter, the post-program voltage for a soft program is applied to the entire word lines and erase verification is then performed at step S1203.

Pre-program and verify operations are then performed on the first word line WL<0> by applying the pre-program voltage Vpgm1 to the first word line WL<0> at step S1205. Here, the pre-program operation is included in the erase operation of the memory block. That is, although a subsequent program operation is not performed after the memory block is erased, the erase operation is completed by performing the pre-program operation of the first word line WL<0>.

Thereafter, a LSB program operation is performed on the first word line WL<0> at step S1207. Here, the program voltage Vpgm is applied to the first word line WL<0> and the pre-pass voltage NVpass is applied to the second word line WL<1>. The pre-pass voltage NVpass makes the second word line WL<1> pre-programmed during the LSB program operation of the first word line WL<0>, as described above in the fifth embodiment.

A MSB program operation is performed in the same manner as that of a general program operation. When the LSB program operation of each word line is performed, the program voltage Vpgm is applied to a selected word line and the pre-pass voltage NVpass is applied to a word line that will be programmed next time.

Figure 13:
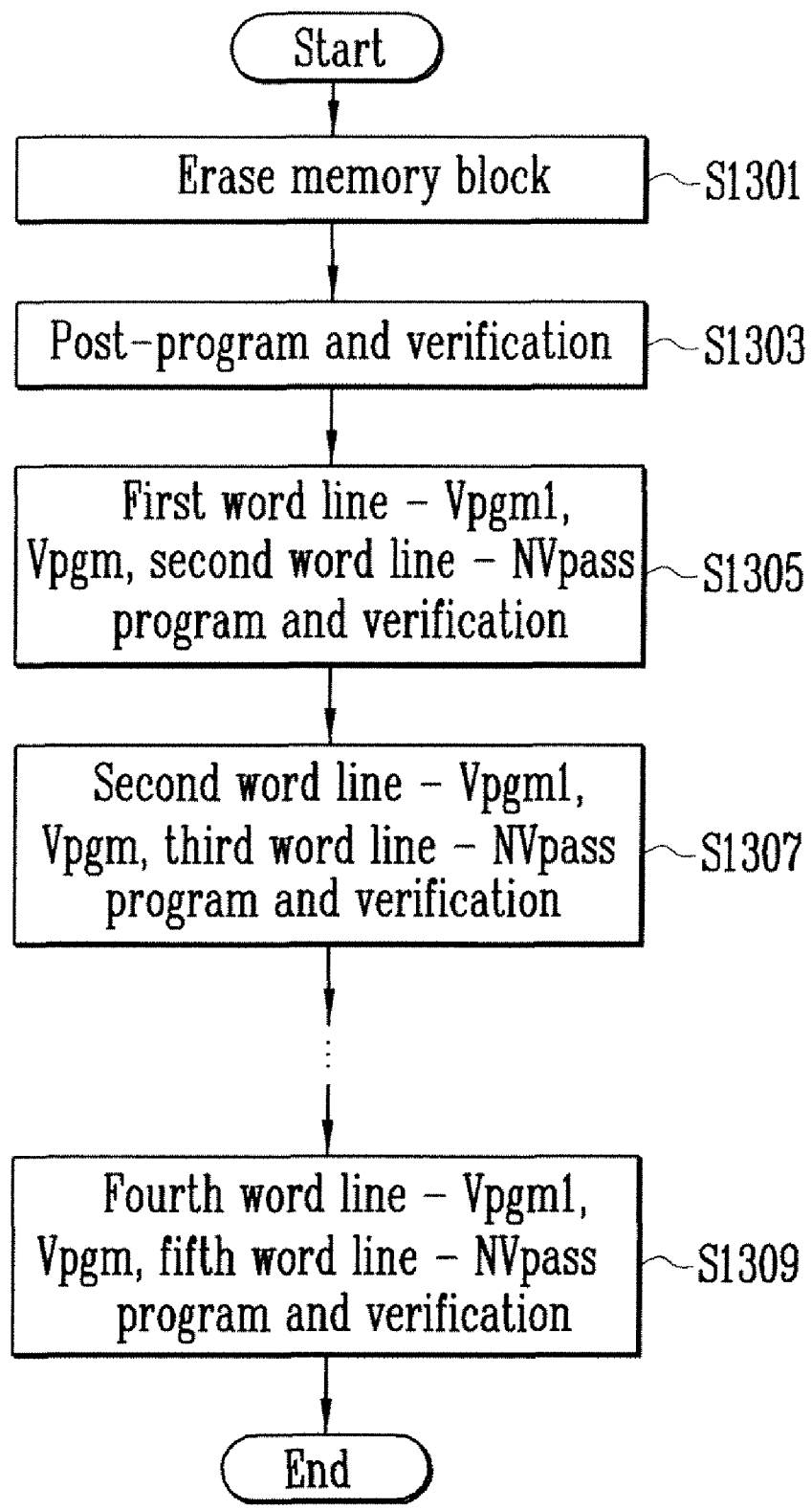
FIG. 13 is a flowchart illustrating a program operation in accordance with another embodiment of the present invention.

FIG. 13 is a flowchart illustrating a program operation in accordance with another embodiment of the present invention.

Table 7 lists voltages applied to word lines when the program operation is performed according to this embodiment of the present invention.

TABLE 7

| | Mode | WL<0> | WL<1> | WL<2> | WL<3> | WL<4> |
|---|---|---|---|---|---|---|
| Erase | Erase | 0 V | | | | |
| | Post-program Verify | Vpgm1 | | | | |
| | | Vverify_erase | | | | |
| LSB (WL<0>) | Pre-program WL<0> | Vpgm1 Vpgm | NVpass NVpass | Vpass Vpass | Vpass Vpass | Vpass Vpass |
| LSB (WL<1>) | Pre-program WL<1> | Vpass Vpass | Vpgm1 Vpgm | NVpass NVpass | Vpass Vpass | Vpass Vpass |
| LSB (WL<2>) | Pre-program WL<2> | Vpass Vpass | Vpass Vpass | Vpgm1 Vpgm | NVpass NVpass | Vpass Vpass |
| LSB (WL<3>) | Pre-program WL<3> | Vpass Vpass | Vpass Vpass | Vpass Vpass | Vpgm1 Vpgm | NVpass NVpass |

Referring to FIG. 13 and Table 7, the erase operation of the memory block BK is performed in the same manner as that of a general method at step S1301. That is, a high voltage is applied to a P well and 0V is applied to the word lines, thus erasing the memory cells. Thereafter, the post-program voltage for a soft program is applied to the entire word lines and erase verification is then performed at step S1303.

A LSB program operation is then performed on the first word line WL<0> at step S1305. Here, memory cells connected to the first word line WL<0> are all in an erase cell state.

In the LSB program operation of the first word line WL<0>, the memory cells of the erase cell state are first pre-programmed by applying the pre-program voltage Vpgm1 to the first word line WL<0>. If verification of the pre-program operation is all pass, the program voltage Vpgm is applied to the first word line WL<0> and the LSB program operation according to an input data is then performed. A pre-program operation is then performed on the second word line WL<1> by applying the pre-pass voltage NVpass to the second word line WL<1> on which a LSB program operation must be performed subsequently.

In the same manner as the above method, the LSB program operation is performed on other word lines by performing pre-program and program operations on other word lines at the same time. A MSB program operation of each word line is performed in the same manner as that of a general MSB program operation at steps S1307 to S1309.

Figure 14:
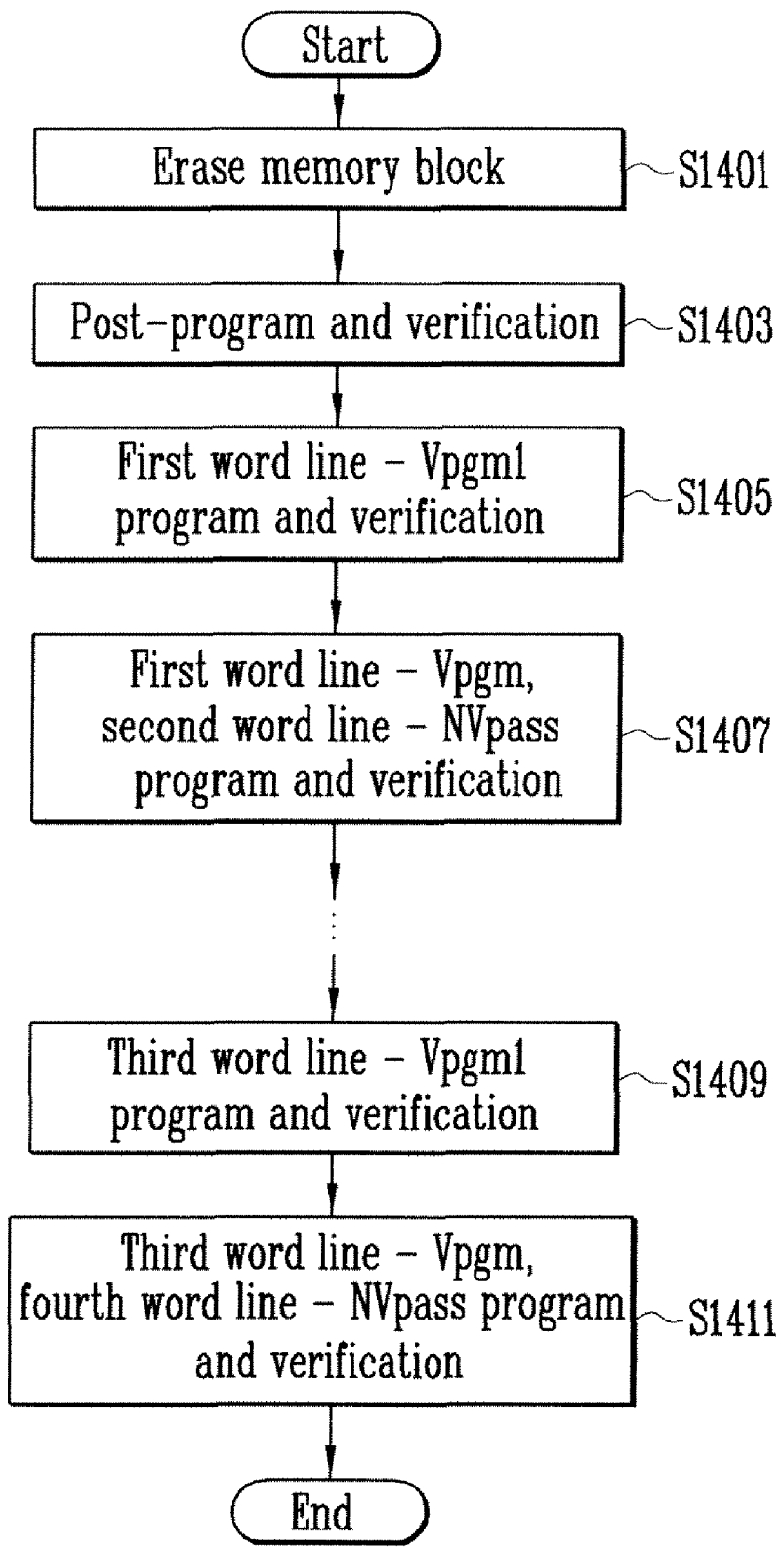
FIG. 14 is a flowchart illustrating a program operation in accordance with another embodiment of the present invention.

FIG. 14 is a flowchart illustrating a program operation in accordance with another embodiment of the present invention.

Table 8 lists voltages applied to word lines when the program operation is performed according to this embodiment of the present invention.

TABLE 8

| | Mode | WL<0> | WL<1> | WL<2> | WL<3> | WL<4> |
|---|---|---|---|---|---|---|
| Erase | Erase | 0 V | | | | |
| | Post-program Verify | Vpgm1 | | | | |
| | | Vverify_erase | | | | |
| LSB (WL<0>) | Pre-program WL<0> | Vpgm1 Vpgm | Vpass NVpass | Vpass Vpass | Vpass Vpass | Vpass Vpass |
| LSB (WL<1>) | Pre-program WL<1> | Vpass Vpass | Vpgm1 Vpgm | Vpass NVpass | Vpass Vpass | Vpass Vpass |
| LSB (WL<2>) | Pre-program WL<2> | Vpass Vpass | Vpass Vpass | Vpgm1 Vpgm | Vpass NVpass | Vpass Vpass |

Referring to FIG. 14 and Table 8, the erase operation of the memory block BK is performed in the same manner as that of a general method at step S1401. That is, a high voltage is applied to a P well and 0V is applied to the word lines, thus erasing the memory cells. Thereafter, the post-program voltage for a soft program is applied to the entire word lines and erase verification is then performed at step S1403.

A pre-program operation is then performed by applying the pre-program voltage Vpgm1 to the first word line WL<0> at step S1405. The first word line WL<0> is then programmed at step S1407. Here, the second word line WL<1> on which a LSB program operation must be subsequently performed is pre-programmed by applying the pre-pass voltage NVpass to the second word line WL<1>.

The LSB program operation is performed on other word lines in the same manner as that of step S1405. A MSB program operation is performed in the same manner as that of a general program method at steps S1409 and S1411.

Figure 15:
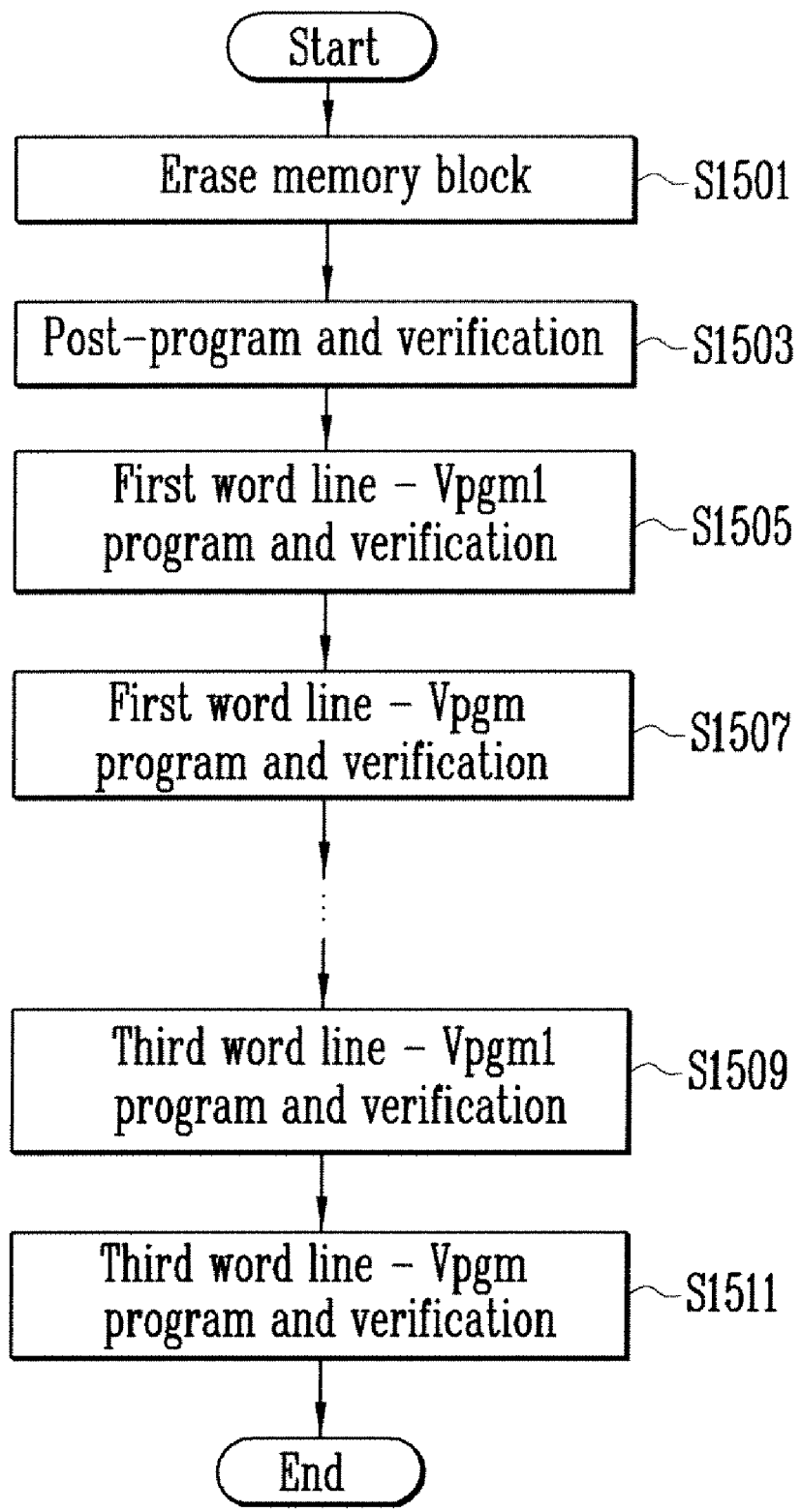
FIG. 15 is a flowchart illustrating a program operation in accordance with another embodiment of the present invention.

FIG. 15 is a flowchart illustrating a program operation in accordance with another embodiment of the present invention.

Table 9 lists voltages applied to word lines when the program operation is performed according to this embodiment of the present invention.

TABLE 9

| | Mode | WL<0> | WL<1> | WL<2> | WL<3> | WL<4> |
|---|---|---|---|---|---|---|
| Erase | Erase | | | 0 V | | |
| | Post-program | | | Vpgm1 | | |
| | Verify | | | Vverify_erase | | |
| MSB (WL<0>) | Pre-program | Vpgm1 | Vpass | Vpass | Vpass | Vpass |
| | WL<0> | Vpgm | Vpass | Vpass | Vpass | Vpass |
| MSB (WL<1>) | Pre-program | Vpass | Vpgm1 | Vpass | Vpass | Vpass |
| | WL<1> | Vpass | Vpgm | Vpass | Vpass | Vpass |
| MSB (WL<2>) | Pre-program | Vpass | Vpass | Vpgm1 | Vpass | Vpass |
| | WL<2> | Vpass | Vpass | Vpgm | Vpass | Vpass |

Referring to FIG. 15 and Table 9, the erase operation of the memory block BK is performed in the same manner as that of a general method at step S1501. That is, a high voltage is applied to a P well and 0V is applied to the word lines, thus erasing the memory cells. Thereafter, the post-program voltage for a soft program is applied to the entire word lines and erase verification is then performed at step S1503.

A LSB program operation is performed on the first word line WL<0> in the same manner as a general method. When a MSB program operation is performed, the first word line WL<0> is pre-programmed by applying the pre-program voltage Vpgm1 to the first word line WL<0> at step S1505. Then, a MSB program operation is performed by applying the program voltage Vpgm to the first word line WL<0> at step S1507.

In the same manner as the above method, the MSB program operation is performed on other word lines at steps S1509 and S1511.

Alternatively, the present invention can be implemented according to the following embodiment.

Figure 16:
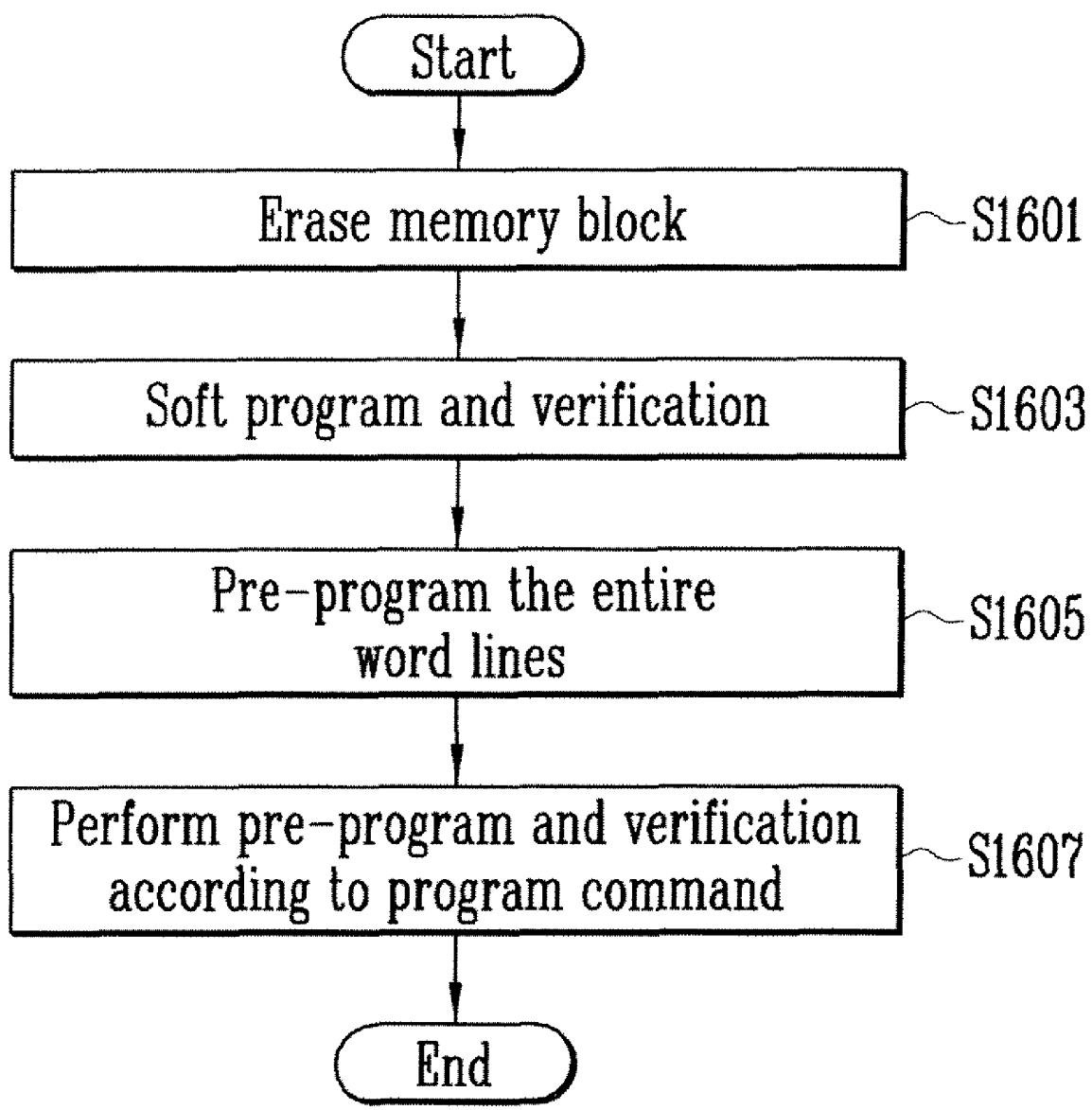
FIG. 16 is a flowchart illustrating a program operation in accordance with another embodiment of the present invention.

FIG. 16 is a flowchart illustrating a program operation in accordance with another embodiment of the present invention.

Referring to FIG. 16, an erase operation of the memory block BK is performed in the same manner as that of a general method at step S1601. That is, a high voltage is applied to a P well and 0V is applied to the word lines, thus erasing the memory cells. Thereafter, a post-program voltage for a soft program is applied to the entire word lines and erase verification is then performed at step S1603.

Before the erase operation is completed, a pre-program operation is performed on the entire word lines per on a bit basis at step S1605. In other words, each word line is programmed on a bit basis until verification of the word line is pass per by applying the pre-program voltage Vpgm1 to each word line. As a result of the pre-program operation, the entire erase cells of the memory block are pre-programmed.

Thereafter, if a program command is input, program and verification operations are performed according to the program command at step S1607.

Figure 17:
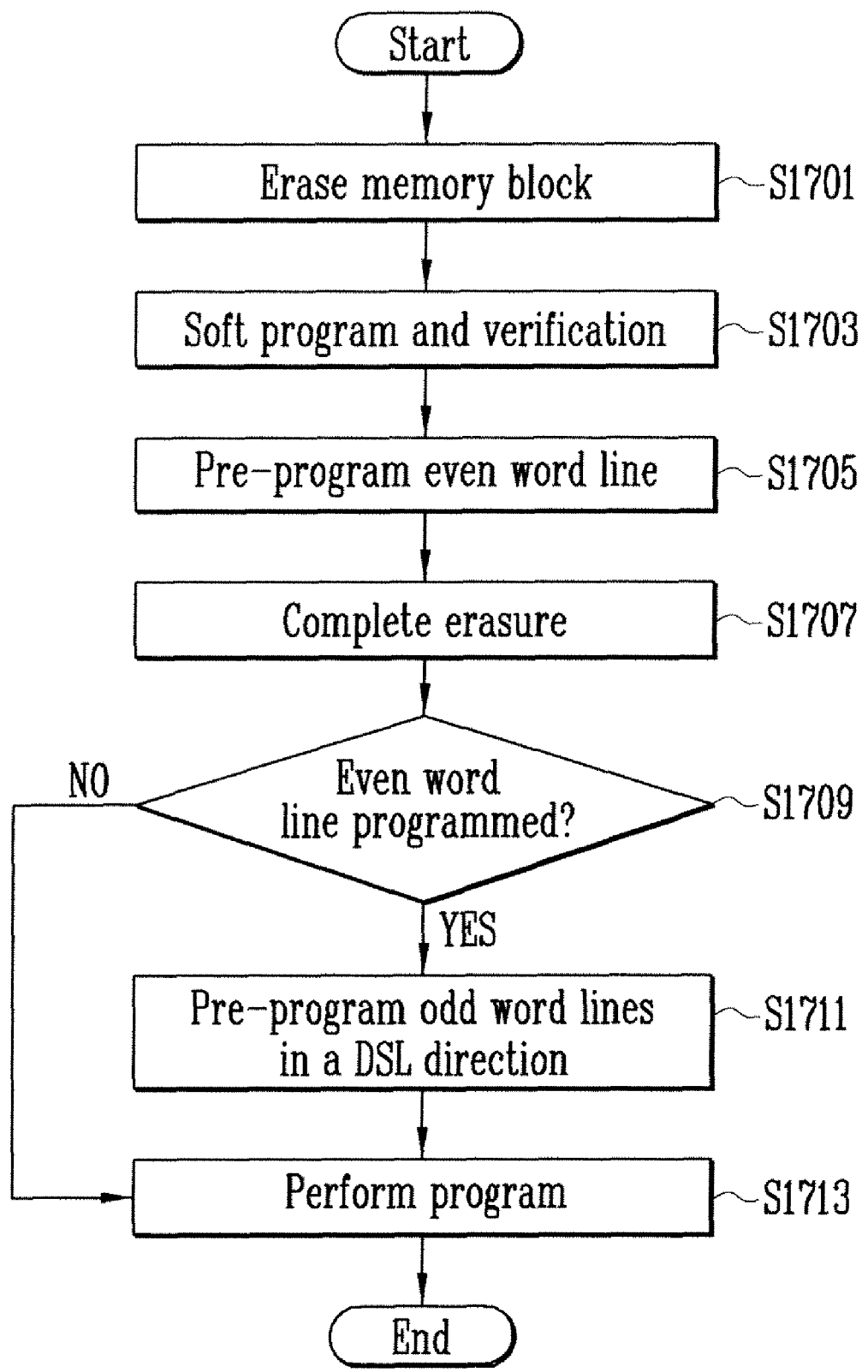
FIG. 17 is a flowchart illustrating a program operation in accordance with still another embodiment of the present invention.

FIG. 17 is a flowchart illustrating a program operation in accordance with another embodiment of the present invention.

Referring to FIG. 17, an erase operation of the memory block BK is performed in the same manner as that of a general method at step S1701. That is, a high voltage is applied to a P well and 0V is applied to the word lines, thus erasing the memory cells. Thereafter, a post-program voltage for a soft program is applied to the entire word lines and erase verification is then performed at step S1703.

Then, the word lines are divided into even word lines and odd word lines. When the odd word lines are first programmed, only the even word lines are pre-programmed at step S1705.

For example, in the case of a memory block including first to thirty-second word lines WL<0> to WL<32>, it is assumed that the first, third, . . . , thirty-first word line WL<0>, WL<2>, . . . , WL<30> are called the odd word lines, and the second, fourth, . . . , the thirty-second word lines WL<1>, . . . , WL<31> are called the even word lines. Here, when a program operation is performed beginning with the first word line WL<0>, that is, the odd word line, only the even word lines are all pre-programmed after the memory block is erased.

If the even word lines are pre-programmed, the erase operation of the memory block is completed at step S1707. If a selected word line is an even word line (step S1709) when a program operation is subsequently performed according to a program command, a corresponding word line and an odd word line being adjacent in the DSL direction are pre-programmed at step S1711.

The selected word line is then programmed at step S1713. For example, when the second word line WL<1> is to be programmed, the third word line WL<2> being adjacent in the DSL direction is first pre-programmed and the second word line WL<1> is then programmed.

The above operation can also be applied to a case where when a word line that is first programmed is the even word line, the odd word lines are first pre-programmed and a program operation is then performed.

Erase cells connected to a word line, which will be programmed subsequently to a selected word line, are pre-programmed using the various methods in order to shift the threshold voltage of the cells close to 0V. Accordingly, interference can be reduced.

As described above, according to the method of programming a non volatile memory device in accordance with embodiments of the present invention, a threshold voltage distribution of erase cells is made narrow. Accordingly, interference caused by a program operation can be reduced. Moreover, various aspects of each of the herein described embodiments may be combined to provide still additional embodiments of the present invention.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of programming a non-volatile memory device, comprising:
   performing a pre-program operation on a word line which is next to a selected word line in the direction of a drain select line by applying pre-program voltage to the word line and pass voltage to remaining word lines; and
   performing a program operation on the selected word line by applying program voltage to the selected word line and pass voltage to unselected word lines.

2. The method of claim 1, wherein the pre-program operation is performed on only erase cells.

3. The method of claim 1, wherein the pre-program voltage is lower than the program voltage.

4. The method of claim 1, wherein the performing the program operation on the selected word line, further comprises:
   performing a LSB (Least Significant Bit) page program operation on the LSB page of the selected word line; and
   performing a MSB (Most Significant Bit) page program operation on the MSB page of the selected word line.

5. The method of claim 4, wherein the performing the LSB page program operation further comprises;
   performing a pre-program operation and a program operation at the same time by increasing the pre-program voltage to the program voltage.

6. The method of claim 5, wherein the performing the LSB page program operation comprises:
   pre-programming the LSB page of the selected word line; and
   programming the LSB page of the selected word line.

7. The method of claim 4, wherein the performing the MSB page program operation further comprises:
   performing a pre-program operation and a program operation at the same time by increasing the pre-program voltage to the program voltage.

8. The method of claim 4, wherein the performing the MSB page program operation further comprises:
   performing a first pre-program operation on the selected word line and the word line which is next to the selected word line in the direction of the drain select line at the same time before the performing the MSB page program operation; and
   performing the pre-program operation and the program operation.

9. A method of programming a non-volatile memory device, comprising:
   performing a pre-program operation on a selected word line by applying a pre-program voltage to the selected word line, a first pass voltage to a word line next to the selected word line in the direction of a drain selected line, and a second pass voltage to remaining word lines; and
   performing a program operation on the selected word line by applying a program voltage to the selected word line and a pass voltage to unselected word lines.

10. The method of claim 9, wherein the first pass voltage is higher than the second pass voltage, but lower than the program voltage.

11. The method of claim 9, wherein the pre-program operation is performed only on erase cells.

12. The method of claim 9, wherein the pre-program operation is performed after a LSB (Least Significant Bit) page program operation of the selected word line.

13. The method of claim 9, wherein the pre-program operation is performed before a LSB (Least Significant Bit) page program operation of the selected word line.

14. The method of claim 9, wherein the pass voltage is as same as the second pass voltage.

15. A method of programming a non-volatile memory device, comprising:
   performing pre-program and pre-program verification operations on word lines on a per bit basis, and
   performing a program and program verification operations on a selected word line.

16. A method of programming a non-volatile memory device having an even word line group and an odd word line group, comprising:
   performing a pre-program operation on the word line group which belongs to a selected word line by applying pre-program voltage to a word line next to the selected word line in the direction of a drain select line; and
   performing a program operation on the selected word line.

17. A method of programming a non-volatile memory device, comprising:
   performing a pre-program operation on a selected word line; and
   performing a program operation on a LSB (Least Significant Bit) page of the selected word line by applying a program voltage to the selected word line, a first pass voltage to a word line next to the selected word line in the direction of a drain selected line, and a second pass voltage to remaining word lines,
   wherein the pre-program operation and the program operation on the LSB page are performed at the same time by increasing a pre-program voltage to the program voltage.

18. The method of claim 17, wherein the performing the pre-program operation on the selected word line comprises:
   applying the pre-program voltage to the selected word line;
   applying the first pass voltage to the word line next to the selected word line in the direction of the drain select line; and
   applying the second pass voltage to the remaining word lines.

19. The method of claim 17, wherein the performing the pre-program operation on the selected word line comprises:
   applying the pre-program voltage to the selected word line; and
   applying the second program voltage to unselected word lines.

20. The method of claim 17, wherein the first pass voltage is higher than the second pass voltage, but lower than the program voltage.

21. The method of claim 17, wherein the pre-program operation is performed only on erase cells.

* * * * *